United States Patent
Nodake et al.

(10) Patent No.: US 7,504,880 B1
(45) Date of Patent: Mar. 17, 2009

(54) AMPLIFIER CIRCUIT

(75) Inventors: Yasuhiro Nodake, Gunma (JP); Yasuaki Hayashi, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 0 days.

(21) Appl. No.: 11/926,611

(22) Filed: Oct. 29, 2007

(30) Foreign Application Priority Data

Aug. 27, 2007 (JP) ............................. 2007-220172

(51) Int. Cl.
*H03F 1/36* (2006.01)
(52) U.S. Cl. .................... 330/86; 330/260; 330/291
(58) Field of Classification Search ............... 330/86, 330/260, 291
See application file for complete search history.

(56) References Cited

U.S. PATENT DOCUMENTS

| | | | | |
|---|---|---|---|---|
| 3,696,304 A | * | 10/1972 | Fricke, Jr. ................... 330/260 |
| 4,041,411 A | * | 8/1977 | Sturgeon ................. 330/207 A |
| 4,288,753 A | * | 9/1981 | Babano ....................... 330/51 |
| 5,508,656 A | * | 4/1996 | Jaffard et al. ................... 330/9 |
| 5,861,775 A | * | 1/1999 | Chen et al. ..................... 330/69 |
| 5,939,938 A | * | 8/1999 | Kalb et al. ..................... 330/51 |
| 6,118,336 A | * | 9/2000 | Pullen et al. ................... 330/10 |

FOREIGN PATENT DOCUMENTS

JP        2001-244760        7/2001

* cited by examiner

*Primary Examiner*—Patricia Nguyen
(74) *Attorney, Agent, or Firm*—Morrison & Foerster LLP

(57) ABSTRACT

An amplifier circuit that is less likely to cause an error in a gain and a DC offset voltage and is suitable for reducing a size and power consumption is offered. A first resistor and a second resistor are connected in series between an input terminal and an output terminal. A third resistor and a fourth resistor are connected in series between a VREFL terminal and a VREFH terminal. A ratio of a resistance of the first resistor to a resistance of the second resistor is equal to a ratio of a resistance of the third resistor to a resistance of the fourth resistor. A voltage at a connecting node between the first resistor and the second resistor is applied to a first differential input terminal (−) of an operational amplifier, while either a voltage at a connecting node between the third resistor and the fourth resistor or VREFH is selectively applied to a second differential input terminal (+) of the operational amplifier. An output of the operational amplifier is outputted through the output terminal as well as being applied to the first differential input terminal through the second resistor that serves as a feedback resistor.

5 Claims, 1 Drawing Sheet

AMPLIFIER CIRCUIT

CROSS-REFERENCE OF THE INVENTION

This application claims priority from Japanese Patent Application No. 2007-220172, the content of which is incorporated herein by reference in its entirety.

BACKGROUND OF THE INVENTION

1. Field of the Invention

This invention relates to an amplifier circuit that has a level shift function.

2. Description of the Related Art

Semiconductor integrated circuits move to finer design rules and a lower power supply voltage. In some cases, however, they are required to operate at a power supply voltage higher than a certain voltage. For example, a semiconductor integrated circuit used for audio signal processing has a signal processing-associated circuit that operates being provided with a low power supply voltage and an output-associated circuit that operates being provided with a higher power supply voltage. In such a case, there is a need to shift a DC level of a signal outputted from the signal processing-associated circuit so as to adjust to a DC level of the output-associated circuit as well as a need to amplify and output the shifted signal in the output-associated circuit.

An outline structure of a conventional semiconductor integrated circuit used in the audio signal processing is described hereafter referring to FIG. 2. The semiconductor integrated circuit shown in FIG. 2 has a signal processing-associated circuit 100 that operates being provided with a first power supply voltage VDDL and an output-associated circuit 101 that operates being provided with a second power supply voltage VDDH that is higher than the first power supply voltage VDDL.

A level shift circuit 102 is provided in a rear stage of the signal processing-associated circuit 100. The level shift circuit 102 changes a DC level of an input signal Vin supplied from an input terminal 103 without changing its amplitude, and is composed of components including an operational amplifier and a plurality of resistors. For more details, refer to FIG. 1 of Japanese Patent Application Publication No. 2001-244760, for example.

When the input signal Vin has amplitude centered around a voltage VREFL, the voltage VREFL is usually set at a half of VDDL in order to secure a maximum dynamic range. Thus, the input signal Vin can swing to its maximum amplitude making a half of VDDL a center of the amplitude.

The output-associated circuit 101 is provided with a resistor 104, a resistor 105 and an operational amplifier 106. A signal outputted from the level shift circuit 102 is applied to a first differential input terminal (−) of the operational amplifier 106 through the resistor 104, while a voltage VREFH is applied to a second differential input terminal (+) of the operational amplifier 106. An output of the operational amplifier 106 is outputted from an output terminal 107 to a circuit such as a speaker (not shown) in a subsequent stage, as well as being applied to the first differential input terminal (−) through the resistor 105 that serves as a feedback resistor.

When an output signal Vout has amplitude centered around the voltage VREFH, the voltage VREFH is usually set at a half of VDDH because of the same reason as described above regarding the input signal Vin. Thus, the output signal Vout can swing to its maximum amplitude making a half of VDDH a center of the amplitude.

Next, the output signal Vout will be described using the voltage VREFH, a resistance R1 of the resistor 104, a resistance R2 of the resistor 105 and the like.

The DC level of the input signal Vin is shifted by (VREFH−VREFL) by the level shift circuit 102. Therefore, when a voltage supplied to the first differential input terminal (−) of the operational amplifier 106 is denoted by V1, V1 is represented by the following equation 1:

$$V1 = \frac{R1 Vout + R2(Vin + VREFH - VREFL)}{R1 + R2} \quad \text{[Equation 1]}$$

Here, the input signal Vin is represented by the following equation 2:

$$Vin = VREFL + vi \quad \text{[Equation 2]}$$

where vi is a change in the input voltage Vin. Therefore, the equation 1 turns into the following equation 3:

$$V1 = \frac{R1 Vout + R2(vi + VREFH)}{R1 + R2} \quad \text{[Equation 3]}$$

On the other hand, when a voltage supplied to the second differential input terminal (+) of the operational amplifier 106 is denoted by V2, V2 is represented by the following equation 4, as described above:

$$V2 = VREFH \quad \text{[Equation 4]}$$

Since a difference between the two differential input voltages to the operational amplifier 106 is ideally zero, V1 is equal to V2. Combining the equation 3 with the equation 4 derives the following equation 5 which represents the output voltage Vout:

$$Vout = \frac{R2}{R1} vi + VREFH \quad \text{[Equation 5]}$$

However, there are problems with the conventional structure shown in FIG. 2. The problems are an error in the gain and a DC offset voltage caused by variations in the level shift operation of the level shift circuit 102.

In order to reduce a size and power consumption of the semiconductor integrated circuit, it is required that the level shift operation and the amplification as described above are implemented with as small circuit area as possible and with low power consumption.

This invention intends to offer an amplifier circuit that is less likely to cause the error in the gain and the DC offset voltage and is suitable for reducing the size and the power consumption.

SUMMARY OF THE INVENTION

This invention is directed to solve the problems addressed above and has following features. This invention offers an amplifier circuit that shifts and amplifies a signal having amplitude centered around a first voltage into a signal having amplitude centered around a second voltage, including a first resistor and a second resistor connected in series between an input terminal and an output terminal, a third resistor and a fourth resistor connected in series between a first terminal to which the first voltage is applied and a second terminal to which the second voltage is applied, and an operational amplifier having a first differential input terminal to which a voltage at a connecting node between the first resistor and the second resistor is applied and a second differential input terminal to which either a voltage at a connecting node between the third resistor and the fourth resistor or the second voltage is selectively applied and providing its output to the output terminal as well as to the first differential input terminal through the second resistor that serves as a feedback resistor, wherein a ratio of a resistance of the first resistor to a resistance of the second resistor is equal to a ratio of a resistance of the third resistor to a resistance of the fourth resistor.

DETAILED DESCRIPTION OF THE INVENTION

Figure 1:
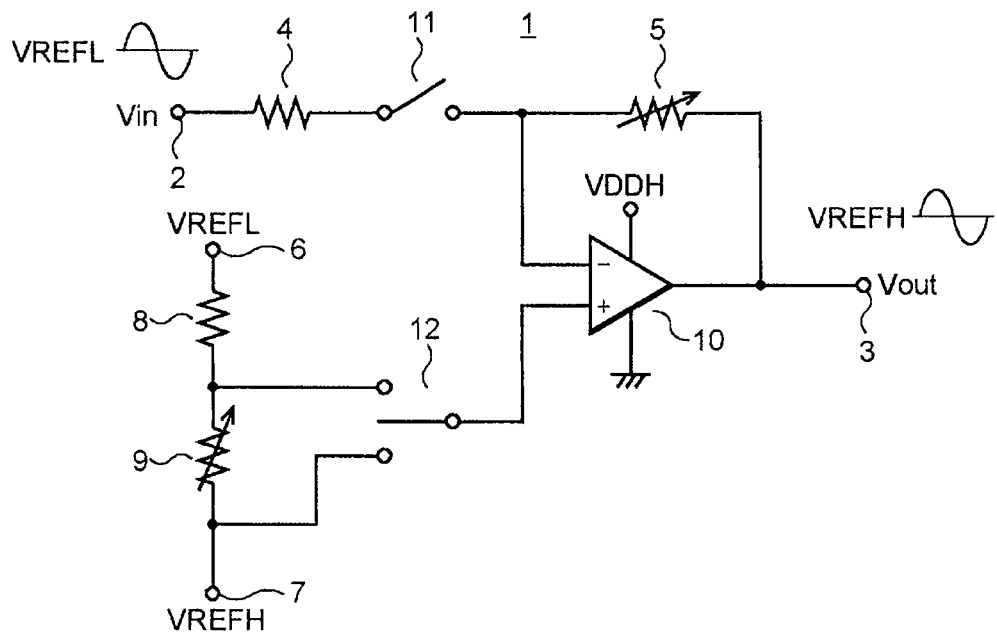
FIG. 1 is a circuit diagram showing an amplifier circuit according to an embodiment of this invention.

An embodiment of this invention will be explained hereinafter, referring to FIG. 1 which shows a circuit diagram of an amplifier circuit 1 according to the embodiment of this invention.

The amplifier circuit 1 receives a VDDL-associated signal outputted from a circuit operating being provided with a first power supply voltage VDDL at an input terminal 2, amplifies as well as shifting the VDDL-associated signal to a VDDH-associated signal that is adjusted to a circuit operating being provided with a second power supply voltage VDDH that is higher than the first power supply voltage VDDL, and outputs the VDDH-associated signal from an output terminal 3. Note that VDDL<VDDH in the embodiment.

A first resistor 4 and a second resistor 5 are connected in series between the input terminal 2 and the output terminal 3. The second resistor 5 may be a variable resistor that can be varied to adjust a gain of an operational amplifier 10, as shown in FIG. 1. In this case, the second resistor 5 is provided with a plurality of resistor elements and a plurality of switches each connected with each of the resistor elements, respectively. A resistance of the second resistor 5 can be varied by selectively turning on the switches so that arbitrarily selected resistor elements are bypassed to vary the resistance of the second resistor 5.

A third resistor 8 and a fourth resistor 9 are connected in series between a VREFL terminal 6 to which a voltage VREFL is applied and a VREFH terminal 7 to which a voltage VREFH is applied.

A ratio of a resistance of the first resistor 4 to a resistance of the second resistor 5 is substantially equal to a ratio of a resistance of the third resistor 8 to a resistance of the fourth resistor 9. It is preferable that the first resistor 4 and the third resistor 8 have the same resistance R1 and the second resistor 5 and the fourth resistor 9 have the same resistance R2. When the second resistor 5 is the variable resistor, the fourth resistor 9 is also made of a variable resistor in accordance with it, and the ratio of the resistance of the first resistor 4 to the resistance of the second resistor 5 is always kept equal to the ratio of the resistance of the third resistor 8 to the resistance of the fourth resistor 9 in normal operation. The voltage VREFL is a half of the first power supply voltage VDDL, and the voltage VREFH is a half of the second power supply voltage VDDH.

The amplifier circuit 1 is provided with the operational amplifier 10. The operational amplifier 10 is structured so that a voltage at a connecting node between the first resistor 4 and the second resistor 5 is applied to its first differential input terminal (−), either a voltage at a connecting node between the third resistor 8 and the fourth resistor 9 or the voltage VREFH is selected by a switch 12, that will be described later, and applied to its second differential input terminal (+), and its output is outputted to a circuit such as a speaker in a subsequent stage through the output terminal 3, as well as being applied to the first differential input terminal (−) through the second resistor 5 that serves as a feedback resistor.

A switch 11 is provided between the first resistor 4 and the first differential input terminal (−). The switch 11 is not limited to be located as described above and may be located between the input terminal 2 and the first resistor 4, for example. The switch 12 is connected with the second differential input terminal (+) of the operational amplifier 10 and controls so that either the voltage at the connecting node between the third resistor 8 and the fourth resistor 9 or the voltage VREFH is applied to the second differential input terminal (+). The switch 11 is controlled to be turned on during a normal operation and turned off during a mute operation. The switch 12 is controlled so that the voltage at the connecting node between the third resistor 8 and the fourth resistor 9 is applied to the second differential input terminal (+) during the normal operation and the voltage VREFH is applied to the second differential input terminal (+) in the mute operation. That is, when the switch 11 is turned off, the input signal to the first differential input terminal (−) is cut off and the output of the operational amplifier 10 becomes the voltage VREFH to accomplish the mute operation. Since the amplifier circuit 1 according to the embodiment is formed with fewer number of operational amplifier compared with the conventional structure that is provided with the level shift circuit 102, the DC offset voltage of the operational amplifier 10 is less likely to be caused. As a result, generation of noise at turning on/off of the mute operation is suppressed.

Next, the output voltage Vout of the amplifier circuit 1 structured as described above in the normal operation will be described. For the sake of simplicity of explanation, it is assumed in the explanation described hereafter that the first resistor 4 and the third resistor 8 have the same resistance R1 and the second resistor 5 and the fourth resistor 9 have the same resistance R2. Although explanation is omitted, it should be noted that it is easily proved that the same result is obtained as long as the ratio of the resistance of the first resistor 4 to the resistance of the second resistor 5 is equal to the ratio of the resistance of the third resistor 8 to the resistance of the fourth resistor 9.

First, when the voltage applied to the first differential input terminal (−) of the operational amplifier 10 is denoted by Vx, Vx is represented by the following equation 6:

$$Vx = \frac{R1 Vout + R2 Vin}{R1 + R2} \qquad \text{[Equation 6]}$$

On the other hand, when the voltage applied to the second differential input terminal (+) of the operational amplifier 10 is denoted by Vy, Vy is represented by the following equation 7:

$$Vy = \frac{R1 VREFH + R2 VREFL}{R1 + R2} \qquad \text{[Equation 7]}$$

Since a difference between the two differential input voltages is ideally zero, Vx is equal to Vy. Thus, the following equation 8 is derived from the equation 6 and the equation 7:

$$Vout = VREFH - \frac{R2}{R1}(Vin - VREFL) \quad \text{[Equation 8]}$$

Since Vin=VREFL+vi, where vi is a change in the input voltage Vin, as shown in the equation 2, Vin−VREFL=vi. Plugging this equation into the equation 8 gives the following equation 9:

$$Vout = \frac{R2}{R1}vi + VREFH \quad \text{[Equation 9]}$$

Figure 2:
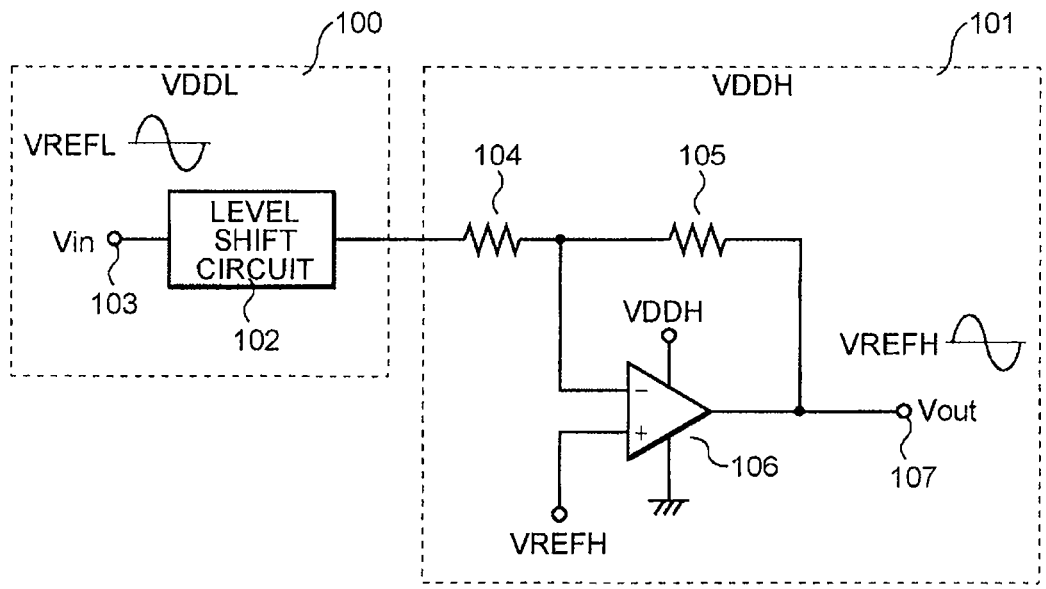
FIG. 2 is a circuit diagram showing a conventional semiconductor integrated circuit.

Comparing the equation 9 with the equation 5 clearly shows that the structure according to the embodiment of this invention gives the same value of the output voltage as obtained with the conventional structure shown in FIG. 2. With the structure according to the embodiment, the level shift operation and the amplification of the input signal Vin can be performed with less number of operational amplifiers without using the conventional level shift circuit 102. As a result, it is possible to resolve the problems of the error in the gain and the DC offset voltage caused by the variations in the level shift operation of the level shift circuit, as existed with the conventional structure.

In addition, the level shift operation and the amplification can be performed with less circuit area and power consumption compared with the conventional structure, since there is no need of forming a large number of semiconductor devices such as the operational amplifier and the resistors that are required in the conventional level shift circuit.

The first resistor 4 and the second resistor 5 that determine the gain of the operational amplifier and the third resistor 8 and the fourth resistor 9 that determine the voltage applied to the second differential input terminal of the operational amplifier 10 can be formed in the same process step, respectively. Therefore, a variation in the ratio of the resistance of the first resistor 4 to the resistance of the second resistor 5 as well as a variation in the ratio of the resistance of the third resistor 8 to the resistance of the fourth resistor 9 is made smaller to attain better accuracy in the level shift operation and the amplification compared with the conventional structure.

Furthermore, the generation of noise at turning on/off of the mute operation is suppressed since the DC offset voltage of the operational amplifier 10 is less likely to occur.

Note that this invention is not limited to the embodiment described above and may be modified within the scope of the invention. For example, although the amplifier circuit that shifts the input signal to the higher DC level is described in the embodiment, it is also possible to form the amplifier circuit so as to shift the input signal to a lower DC level. This invention can be widely applied as a technology to level-shift, amplify and transfer a signal between circuits operating at power supply voltages different from each other.

With the structure of the amplifier circuit according to the embodiment of this invention, the operational amplifier can perform both the level shift operation and the amplification. As a result, the need for the conventional level shift circuit is eliminated to reduce the power consumption and the size of the amplifier circuit. Also, it is made possible to prevent the error in the gain and the DC offset voltage caused by the variations in the level shift operation of the level shift circuit, as existed with the conventional structure.

What is claimed is:

1. An amplifier circuit for level-shifting and amplifying a signal, comprising:
    an input terminal receiving a signal varying around a first voltage;
    an output terminal outputting a signal varying around a second voltage;
    a first terminal receiving the first voltage;
    s second terminal receiving the second voltage;
    a first resistor and a second resistor connected in series between the input terminal and the output terminal;
    a third resistor and a fourth resistor connected in series between the first terminal and the second terminal;
    an operational amplifier comprising a first differential input terminal and a second differential input terminal, the first differential input terminal being connected to a connecting node between the first resistor and the second resistor; and
    a first switch that selects and supplies to the second differential input terminal either the second voltage or a voltage at a connecting node between the third resistor and the fourth resistor,
    wherein an output of the operational amplifier is supplied to the output terminal and fed back to the first differential input terminal through the second resistor, and
    a ratio of a resistance of the first resistor to a resistance of the second resistor is equal to a ratio of a resistance of the third resistor to a resistance of the fourth resistor.

2. The amplifier circuit of claim 1, further comprising a second switch connected between the first resistor and the first differential input terminal and configured to disconnect the first differential input terminal from the first resistor during a mute operation of the amplifier circuit.

3. The amplifier circuit of claim 1, wherein the second resistor and the fourth resistor are variable resistors.

4. The amplifier circuit of claim 1, wherein the resistance of the first resistor is equal to the resistance of the third resistor and the resistance of the second resistor is equal to the resistance of the fourth resistor.

5. The amplifier circuit of claim 2, wherein the first switch is configured to select the second voltage during the mute operation.

* * * * *